(12) United States Patent
Mohamadi

(10) Patent No.: US 7,126,542 B2
(45) Date of Patent: Oct. 24, 2006

(54) INTEGRATED ANTENNA MODULE WITH MICRO-WAVEGUIDE

(76) Inventor: Farrokh Mohamadi, 8 Halley, Irvine, CA (US) 92612-3797

( * ) Notice: Subject to any disclaimer, the term of this patent is extended or adjusted under 35 U.S.C. 154(b) by 0 days.

(21) Appl. No.: 11/074,027

(22) Filed: Mar. 7, 2005

(65) Prior Publication Data
US 2005/0156789 A1    Jul. 21, 2005

Related U.S. Application Data

(60) Continuation-in-part of application No. 11/049,098, filed on Feb. 2, 2005, which is a continuation-in-part of application No. 11/004,402, filed on Dec. 3, 2004, which is a division of application No. 10/423,160, filed on Apr. 25, 2003, now Pat. No. 6,870,503.

(60) Provisional application No. 60/427,665, filed on Nov. 19, 2002, provisional application No. 60/428,409, filed on Nov. 22, 2002, provisional application No. 60/431,587, filed on Dec. 5, 2002, provisional application No. 60/436,749, filed on Dec. 27, 2002.

(51) Int. Cl.
*H01Q 1/38* (2006.01)
(52) U.S. Cl. .............................. 343/700 MS
(58) Field of Classification Search ......... 343/700 MS, 343/795, 772, 754, 853
See application file for complete search history.

(56) References Cited
U.S. PATENT DOCUMENTS 6,535,168 B1 * 3/2003 Marumoto et al. .. 343/700 MS
6,642,889 B1 * 11/2003 McGrath ............. 343/700 MS
6,727,853 B1 * 4/2004 Sasada et al. ........ 343/700 MS
6,765,535 B1 * 7/2004 Brown et al. ........ 343/700 MS
7,034,751 B1 * 4/2006 Brown et al. ........ 343/700 MS

* cited by examiner

*Primary Examiner*—Trinh Dinh
*Assistant Examiner*—Huedung X. Cao
(74) *Attorney, Agent, or Firm*—Jonathan W. Hallman; MacPherson Kwok Chen & Heid LLP

(57) ABSTRACT

In one embodiment, an antenna array is provided that includes a semiconductor substrate having a first surface and an opposing second surface; a plurality of heavily-doped contact regions extending from the first surface to the second surface; a plurality of antennas formed on an insulating layer adjacent the first surface, each antenna being coupled to corresponding ones of the contact regions by vias; driving circuitry formed on the second surface of the substrate, wherein the driving circuitry is configured such that each antenna corresponds to an RF beam forming interface circuit adapted to perform at least one of phase-shifting and attenuating an RF signal according to a transmit beam forming command to form an RF driving signal for driving the corresponding antenna, the RF beam forming interface circuit also adapted to perform at least one of phase-shifting and attenuating a received RF signal from the corresponding antenna according to a receive beam forming command, and a waveguide network formed in a network substrate adjacent the second surface, wherein the waveguide network is adapted to provide the RF signal to and to receive the received RF signal from each RF beam forming interface circuit.

16 Claims, 8 Drawing Sheets

INTEGRATED ANTENNA MODULE WITH MICRO-WAVEGUIDE

RELATED APPLICATION

This application is a continuation-in-part of U.S. Ser. No. 11/049,098, filed Feb. 2, 2005, which in turn is a continuation-in-part of U.S. Ser. No. 11/004,402, filed Dec. 3, 2004, which in turn is a divisional application of U.S. Ser. No. 10/423,160, filed Apr. 25, 2003 now U.S. Pat. No. 6,870,503 which claims the benefit of U.S. Provisional Application No. 60/427,665, filed Nov. 19, 2002, U.S. Provisional Application No. 60/428,409, filed Nov. 22, 2002, U.S. Provisional Application No. 60/431,587, filed Dec. 5, 2002, and U.S. Provisional Application No. 60/436,749, filed Dec. 27, 2002. The contents of all seven of these applications are hereby incorporated by reference in their entirety.

TECHNICAL FIELD

The present invention relates generally to antennas, and more particularly to an integrated antenna module.

BACKGROUND

Conventional high-frequency antennas are often cumbersome to manufacture. For example, antennas designed for 100 GHz bandwidths typically use machined waveguides as feed structures, requiring expensive micro-machining and hand-tuning. Not only are these structures difficult and expensive to manufacture, they are also incompatible with integration to standard semiconductor processes.

As is the case with individual conventional high-frequency antennas, beam forming arrays of such antennas are also generally difficult and expensive to manufacture. Conventional beam forming arrays require complicated feed structures and phase-shifters that are impractical to be implemented in a semiconductor-based design due to its cost, power consumption and deficiency in electrical characteristics such as insertion loss and quantization noise levels. In addition, conventional beam forming arrays become incompatible with digital signal processing techniques as the operating frequency is increased. For example, at the higher data rates enabled by high frequency operation, multipath fading and cross-interference becomes a serious issue. Adaptive beam forming techniques are known to combat these problems. But adaptive beam forming for transmission at 10 GHz or higher frequencies requires massively parallel utilization of A/D and D/A converters.

Accordingly, there is a need in the art for improved semiconductor-based antenna arrays.

SUMMARY

In accordance with one aspect of the invention, an antenna array is provided that includes: a semiconductor substrate having a first surface and an opposing second surface; a plurality of heavily-doped contact regions extending from the first surface to the second surface; a plurality of antennas formed on an insulating layer adjacent the first surface, each antenna being coupled to corresponding ones of the contact regions by vias; driving circuitry formed on the second surface of the substrate, wherein the driving circuitry is configured such that each antenna corresponds to an RF beam forming interface circuit adapted to perform at least one of phase-shifting and attenuating an RF signal according to a transmit beam forming command to form an RF driving signal for driving the corresponding antenna, the RF beam forming interface circuit also adapted to perform at least one of phase-shifting and attenuating a received RF signal from the corresponding antenna according to a receive beam forming command; and a waveguide network formed in a network substrate adjacent the second surface, wherein the waveguide network is adapted to provide the RF signal to and to receive the received RF signal from each RF beam forming interface circuit.

In accordance with another aspect of the invention, an antenna array is provided that includes: a semiconductor substrate having a first surface and an opposing second surface; a plurality of heavily-doped contact regions extending from the first surface to the second surface; a plurality of antennas formed on an insulating layer adjacent the first surface, each antenna being coupled to corresponding ones of the contact regions by vias; driving circuitry formed on the second surface of the substrate, wherein the driving circuitry is configured such that each antenna corresponds to a phase-locked loop and mixer, each phase-locked loop operable to receive a phase-adjusted version of a reference clock and provide an oscillator output signal that is synchronous with the phase-adjusted version of the reference clock, wherein if the phase-locked loop is configured for transmission, the oscillator output signal is upconverted in the circuit's mixer and the upconverted signal transmitted by the corresponding antenna, and wherein if the phase-locked loop is configured for reception, a received signal from the corresponding antenna is downconverted in the mixer responsive to the oscillator output signal; and a waveguide network formed in a network substrate adjacent the second surface, wherein the waveguide network is adapted to provide the phase-adjusted versions of the reference clock to the phase-locked loops.

The invention will be more fully understood upon consideration of the following detailed description, taken together with the accompanying drawings.

DETAILED DESCRIPTION

The present invention provides a beam forming antenna array. This antenna array utilizes and expands upon the beam forming capabilities described in copending U.S. Ser. No. 10/423,303, filed Apr. 25, 2003, Ser. No. 10/423,106, filed Apr. 25, 2003, Ser. No. 10/422,907, filed Apr. 25, 2003, Ser. No. 10/423,129, filed Apr. 25, 2003, Ser. No. 10/860,526, filed Jun. 3, 2004, and Ser. No. 10/942,383, filed Sep. 16, 2004; the contents of all of which are hereby incorporated by reference in their entirety.

Figure 1:
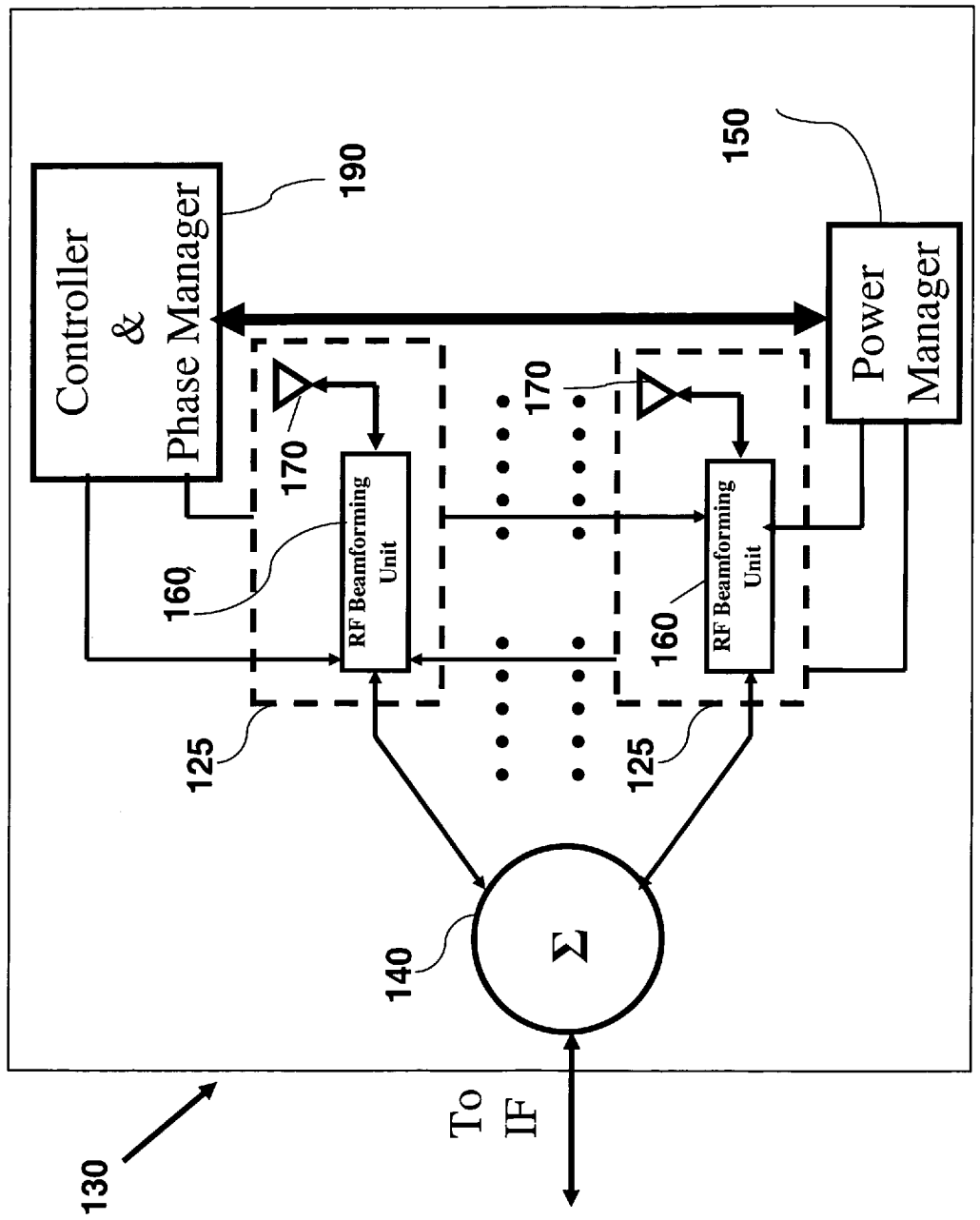
FIG. 1 is a block diagram of a beam forming antenna array in which the beam forming is performed in the RF domain.

One embodiment of a beam forming antenna system described in the above-described applications is shown in FIG. 1, which illustrates an integrated RF beam forming and controller unit 130. In this embodiment, the receive and transmit antenna arrays are the same such that each antenna 170 functions to both transmit and receive. A plurality of integrated antenna circuits 125 each includes an RF beam forming interface circuit 160 and receive/transmit antenna 170. RF beam forming interface circuit 160 adjusts the phase and/or the amplitude of the received and transmitted RF signal responsive to control from a controller/phase manager circuit 190.

Figure 2:
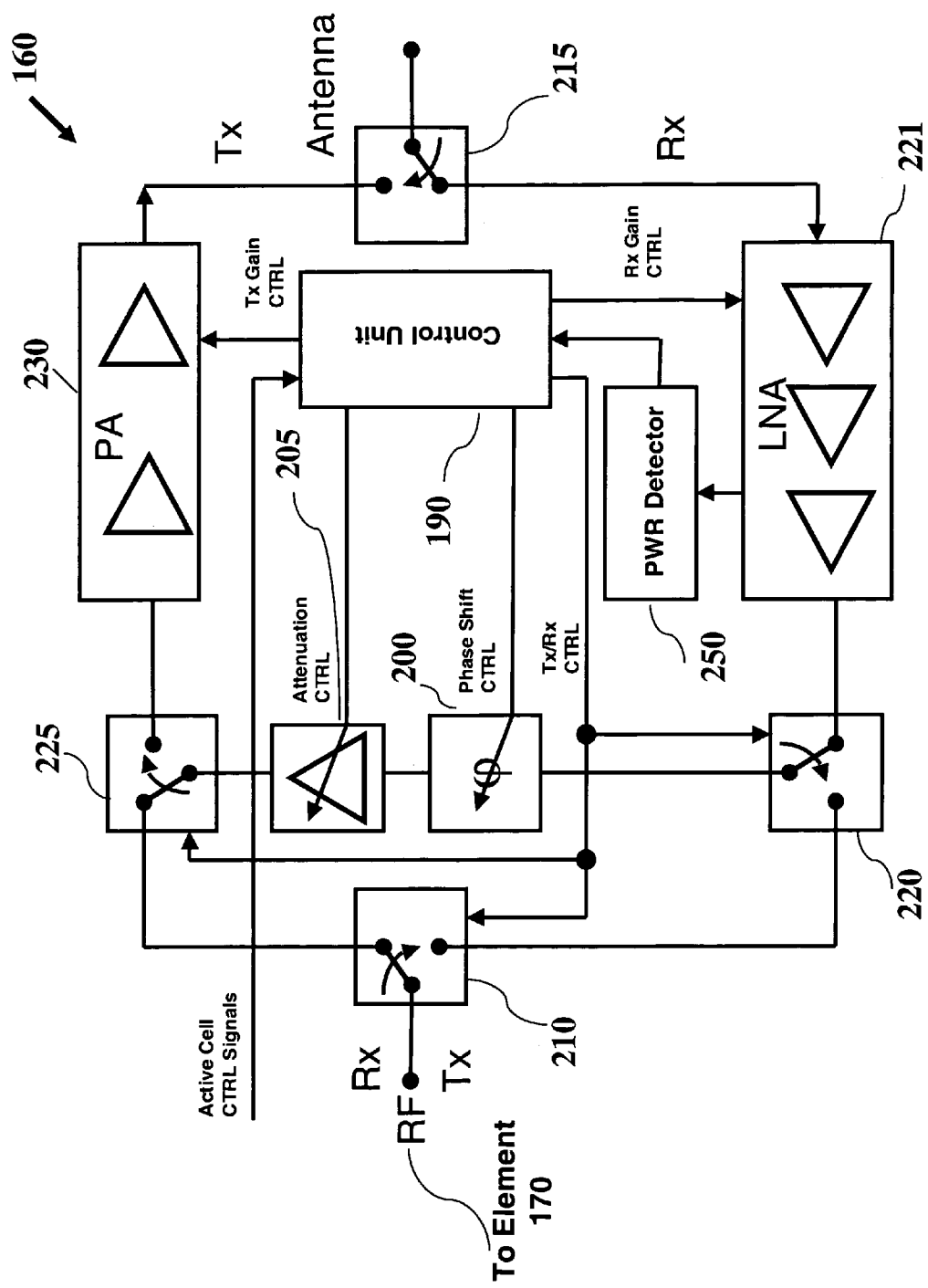
FIG. 2 is a schematic illustration of an RF beam forming interface circuit for the array of FIG. 1.

A circuit diagram for an exemplary embodiment of RF beam forming interface circuit 160 is shown in FIG. 2. Note that the beam forming performed by beam forming circuits 160 may be performed using either phase shifting, amplitude shifting, or a combination of both phase shifting and amplitude shifting. Accordingly, RF beam forming interface circuit 160 is shown including both a variable phase shifter 200 and a variable attenuator 205. It will be appreciated, however, that the inclusion of either phase shifter 200 or attenuator 205 will depend upon the type of beam forming being performed. To provide a compact design, RF beam forming circuit may include RF switches/multiplexers 210, 215, 220, and 225 so that phase shifter 200 and attenuator 205 may be used in either a receive or transmit configuration. For example, in a receive configuration RF switch 215 routes the received RF signal to a low noise amplifier 221. The resulting amplified signal is then routed by switch 220 to phase shifter 200 and/or attenuator 205. The phase shifting and/or attenuation provided by phase shifter 200 and attenuator 205 are under the control of controller/phase manager circuit 190. The resulting shifted signal routes through RF switch 225 to RF switch 210. RF switch 210 then routes the signal to IF processing circuitry (not illustrated).

In a transmit configuration, the RF signal received from IF processing circuitry (alternatively, a direct downconversion architecture may be used to provide the RF signal) routes through RF switch 210 to RF switch 220, which in turn routes the RF signal to phase shifter 200 and/or attenuator 205. The resulting shifted signal is then routed through RF switch 225 to a power amplifier 230. The amplified RF signal then routes through RF switch 215 to antenna 170 (FIG. 1). It will be appreciated, however, that different configurations of switches may be implemented to provide this use of a single set of phase-shifter 200 and/or attenuator 205 in both the receive and transmit configuration. In addition, alternate embodiments of RF beam forming interface circuit 160 may be constructed not including switches 210, 220, and 225 such that the receive and transmit paths do not share phase shifter 200 and/or attenuator 205. In such embodiments, RF beam forming interface circuit 160 would include separate phase-shifters and/or attenuators for the receive and transmit paths.

To provide the beam forming capability, a power detector 250 functions as a received signal strength indicator to measure the power in the received RF signal. For example, power detector 250 may comprise a calibrated envelope detector. Power manager 150 may detect the peak power determined by the various power detectors 250 within each integrated antenna circuit 125. The integrated antenna circuit 125 having the peak detected power may be denoted as the "master" integrated antenna circuit. Power manager 150 may then determine the relative delays for the envelopes for the RF signals from the remaining integrated antenna circuits 125 with respect to the envelope for the master integrated antenna circuit 125. To transmit in the same direction as this received RF signal, controller/phase manager 190 may determine the phases corresponding to these detected delays and command the transmitted phase shifts/attenuations accordingly. Alternatively, a desired receive or transmit beam forming direction may simply be commanded by controller/phase manager 190 rather than derived from a received signal. In such embodiment, power managers 150 and 250 need not be included since phasing information will not be derived from a received RF signal.

Regardless of whether integrated antenna circuits 125 perform their beam forming using phase shifting and/or amplitude shifting, the shifting is performed on the RF signal received either from the IF stage (in a transmit mode) or from its antenna 170 (in a receive mode). By performing the beam forming directly in the RF domain as discussed with respect to FIGS. 1 and 2, substantial savings are introduced over a system that performs its beam forming in the IF or baseband domain. Such IF or baseband systems must include A/D converters for each RF channel being processed. In contrast, the system shown in FIG. 1 may supply a combined RF signal from an adder 140. From an IF standpoint, it is just processing a single RF channel for the system of FIG. 1, thereby requiring just a single A/D. Accordingly, the following discussion will assume that the beam forming is performed in the RF domain. The injection of phase and/or attenuation control signals by controller/phase manager circuit 190 into each integrated antenna circuit 125 may be performed inductively as discussed in U.S. Ser. No. 10/423,129.

Figure 3:
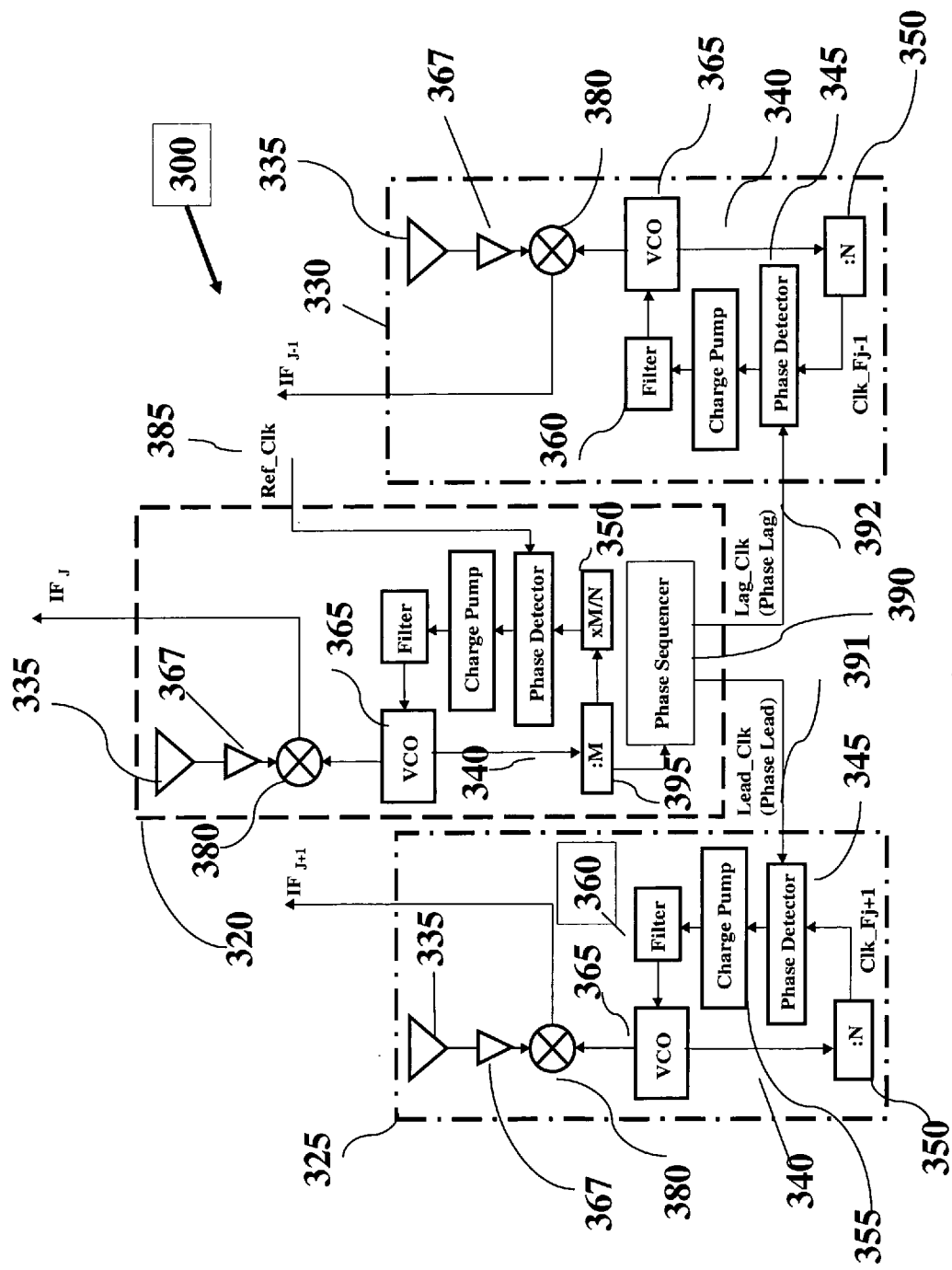
FIG. 3 is a schematic illustration of a beam forming antenna array having a phase distribution scheme.

The "single RF channel" advantage just described with respect to FIGS. 1 and 2 is also provided by the phase distribution scheme illustrated in FIG. 3. In this embodiment, an antenna array 300 is formed from an array of integrated antenna circuits such as a reference antenna circuit 320 and slave antenna circuits 325 and 330. Each integrated antenna circuit includes an antenna 335 that acts as a resonator and load for a self-contained phase-locked loop (PLL) 340. As known in the PLL arts, there are a variety of architectures that perform the essential function of a PLL—maintaining an output signal synchronous with a reference signal. In the embodiment illustrated in FIG. 3, each PLL 340 includes a phase detector 345 that receives as inputs a divided signal from a loop divider 350 and a reference signal. Phase detector 345 compares the phases of these input signals and adjusts input currents provided to a charge pump 355 accordingly. If the divided signal from loop divider 350 lags the reference input, charge pump 535 charges a first capacitor (not illustrated) in a loop filter 360 and discharges a second capacitor in loop filter 360. Conversely, if the divided signal leads the reference input, the first capacitor is discharged and the second capacitor charged. Loop filter 360 filters the resulting charges on these capacitors to provide a control voltage to a voltage-controlled oscillator (VCO) 365, which in turn provides an output signal that is received by both a mixer 380 and loop divider 350. Loop divider 350 divides the VCO output signal according to a factor N and provides the divided signal to phase detector 345 as discussed previously. In this fashion, PLL 340 keeps the output signal of VCO 365 synchronous with the reference signal provided to phase detector 345. It will be appreciated that the above-described PLL architecture is merely exemplary. Other architectures are known and may be implemented within the present invention such as that used in a set-reset loop filters.

Should an integrated antenna circuit be used to receive signals, the corresponding antenna 335 provides a received signal to a low-noise amplifier (LNA) 367, which in turn provides an amplified received signal to mixer 380. Mixer 380 beats the output signal of VCO 365 with the amplified received signal to produce an intermediate frequency (IF) signal. The antenna-received signal is thus down converted into an IF signal in the well-known super-heterodyne fashion. Because the amplified received signal from LNA 367 is downconverted according to the output signal of VCO 365, the phasing of the resulting IF signal is controlled by the phasing of the reference signal received by PLL 340. By altering the phase of the reference signal, the IF phasing is altered accordingly. The resulting IF signals may be combined as discussed with respect to FIG. 1 such that just a single A/D converter (single channel RF) is necessary.

Conversely, if an integrated antenna circuit is used to transmit signals, each mixer 380 up-converts an IF signal according to the output signal (which acts as a local oscillator (LO) signal) from the corresponding VCO 365. The up-converted signal is received by the corresponding antenna 335 using a transmission path (not illustrated) coupling mixer 380 and antenna 335 within each antenna element. Antenna 335 then radiates a transmitted signal in response to receiving the up-converted signal. In this fashion, the transmitted signals are kept phase-locked to reference signals received by phase detectors 45. It will be appreciated that this phase locking may be achieved using other PLL architectures. For example, a set-reset loop filter achieves phase lock using a current controlled oscillator (CCO) rather than a VCO. These alternative PLL architectures are also compatible with the present invention.

A phase management system is used to distribute the reference signals to each integrated antenna circuit. Note that the phase detector 345 in reference antenna circuit 320 receives a reference clock 385 as its reference signal. Reference clock 385 is provided by a master clock circuit (not illustrated). Reference antenna circuit 320 includes a programmable phase sequencer 90 to generate the reference signals for slave antenna circuits 325 and 330. Thus, only reference antenna circuit 320 needs to receive externally-generated reference clock 85.

Reference antenna circuit 320 includes an auxiliary loop divider 395 that divides its VCO output signal to provide a reference signal to programmable phase sequencer 390. According to the programming within programmable phase sequencer 390, it provides a reference signal 391 leading in phase and a reference signal 392 lagging in phase with respect to the reference signal from auxiliary loop divider 395. Slave antenna element 325 receives reference signal 391 whereas slave antenna element 330 receives reference signal 392. Thus, should array 300 be used to transmit, the antenna output from slave element 325 will lead in phase and the antenna output from slave element 330 will lag in phase with respect to the antenna output from reference element 320. This lag and lead in phase will correspond to the phase offsets provided by reference signals 391 and 392 with respect to reference clock 85. Conversely if antenna array 10 is used as a receiver, the IF signals from slave antenna circuits 325 and 330 will lag and lead in phase with respect to the IF signal from reference antenna circuit 320 by amounts corresponding to the phase offsets provided by reference signals 391 and 392 with respect to reference clock 385.

As compared to the phase distribution scheme of FIG. 3, the integrated antenna architecture discussed with respect to FIG. 1 performs its phase-shifting directly on the RF signal provided by, for example, an IF processing stage. In one embodiment, the present invention provides a micro-waveguide for distributing the RF signal to and from the various integrated antenna units 125. In an alternative embodiment, the present invention provides a micro-waveguide for distributing the phases (for example, reference clock 85 and reference signals 391 and 392) in a phase distribution architecture. Advantageously, these embodiments are compatible with wafer scale integration of the integrated antenna units and the micro-waveguide structure. Accordingly, the present invention is independent of whether an RF distribution or phase distribution scheme is implemented.

Figure 4:
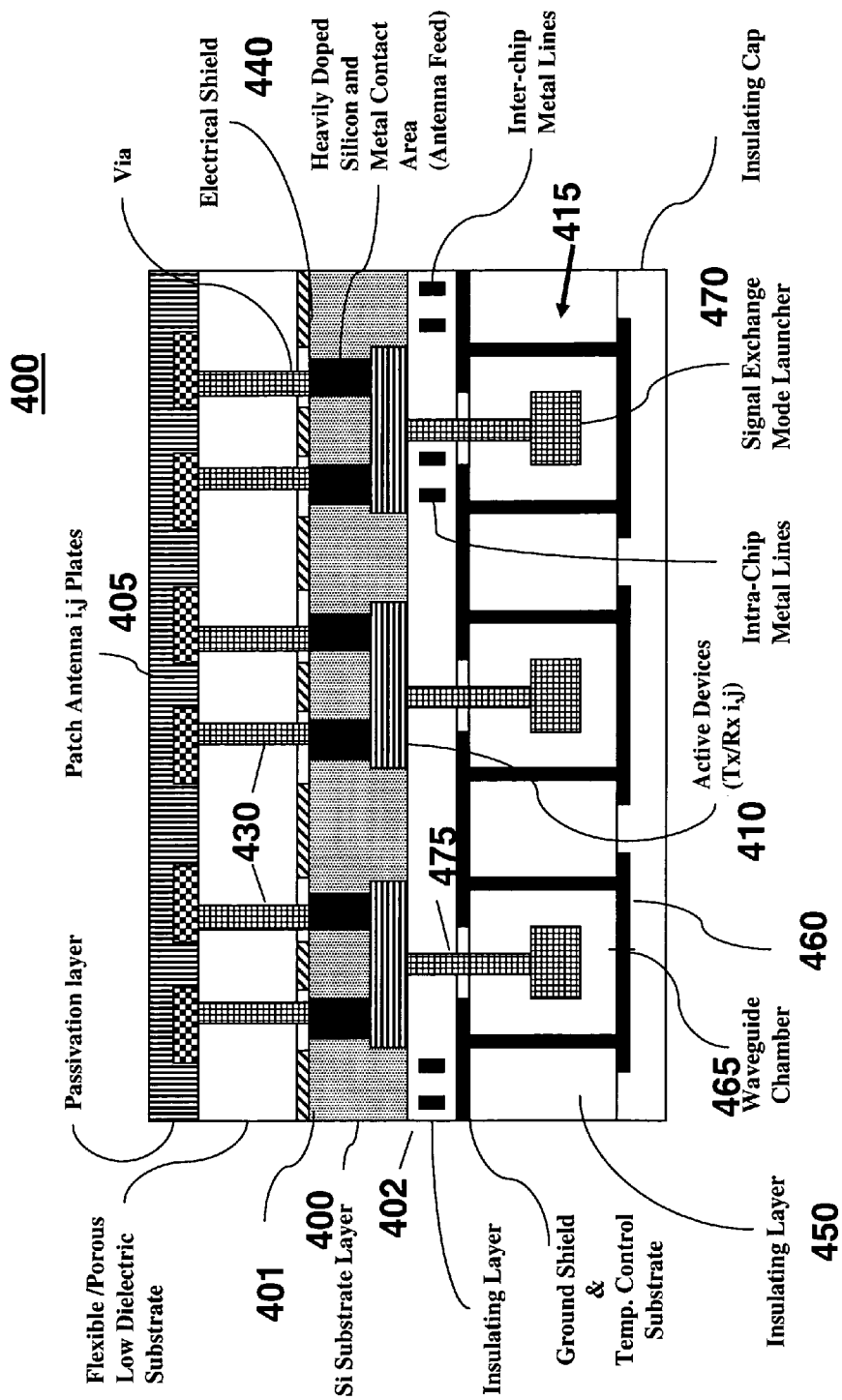
FIG. 4 is a cross-sectional view of an integrated antenna module in accordance with an embodiment of the invention.

Turning now to FIG. 4, a three-layer wafer scale integrated antenna module (WSAM) 400 is shown in cross-section. WSAM 400 includes a semiconductor substrate 400. On a first surface 401 of substrate 400, antennas such as patches 405 for the integrated antenna circuits are formed as discussed, for example, in U.S. Ser. No. 10/423,106. Active circuitry 410 for the corresponding integrated antenna circuits that incorporate these antennas on formed on a second surface 402 of substrate 400. Thus, WSAM 400 includes the "back side" feature disclosed in U.S. Ser. No. 10/942,383 in that the active circuitry 410 and antennas 405 are separated on either side of substrate 400. In this fashion, electrical isolation between the active circuitry and the antenna elements is enhanced. Moreover, the ability to couple signals to and from active circuitry 410 is also enhanced.

Adjacent to second surface 402 is the micro-waveguide distribution network 415. The signal distributed by network 415 depend upon the architecture as discussed with respect to FIGS. 1 through 3. For example, if the active circuitry 410 and corresponding antenna elements 405 form integrated antenna circuits such as those discussed with respect to FIG. 1, network 415 distributes the RF signal to and from the IF processing stage (or direct down-conversion stage depending upon the receiver architecture). Alternatively, should active circuitry 410 and corresponding antenna elements 405 form integrated antenna circuits such as those discussed with respect to FIG. 3, network 415 distributes the reference signals/clock to the various integrated antenna circuits.

Network 415 comprises waveguides that may be formed using metal layers in a semiconductor process such as CMOS as discussed in, for example, U.S. Ser. No. 10/423,106. However, it will be appreciated the waveguide diameter is then limited by maximum separation achievable between metal layers in such semiconductor processes. Typically, the maximum achievable waveguide diameter would thus be 7 microns or less, thereby limiting use of the waveguide to frequencies above 40 GHz. To accommodate lower frequency operation, micro-machined waveguides may be utilized as shown in FIG. 4.

As discussed in U.S. Ser. No. 10/942,383, a heavily doped deep conductive junction 420 couples active circuitry 410 to vias 430 that in turn couple to antenna elements 405. Formation of junctions 420 is similar to a deep diffusion junction process used for the manufacturing of double diffused CMOS (DMOS) or high voltage devices. It provides a region of low resistive signal path to minimize insertion loss to antenna elements 405.

Upon formation of junctions 420 in substrate 400, active circuitry 410 may be formed using standard semiconductor processes. Active circuitry 410 may then be passivated by applying a low temperature deposited porous SiOx and a thin layer of nitridized oxide (SixOyNz) as a final layer of passivation. Thickness of these sealing layers may range from a fraction of a micron to a few microns. Surface 402 may then be coated with a thermally conductive material and taped to a plastic adhesive holder to flip substrate 400 to expose surface 401. Substrate 400 may then be back ground to reduce its thickness to a few hundreds of micro-meters.

An electric shield 440 may then be sputtered or alternatively coated using conductive paints on surface 401. Shield 440 forms a reflective plane for directivity and also shields antenna elements 405. In addition, parts of shield 440 forms ohmic contacts to junctions 420. For example, metallic lumps may be deposited on junctions 420. These lumps ease penetration of via rods 430 to form ohmic contacts with active circuitry 410.

Network 415 may be formed in a glass, metallic, oxide, or plastic-based insulating layer/substrate 450. Depending upon the desired propagation frequency in network 415, the thickness of substrate 450 may range from a few millimeters to multiple tens of microns. A rectangular or circular cavity is then etched into substrate 450 to form a waveguide cavity 465. The walls of the cavity may then be metallically coated using silver, copper, aluminum, or gold to provide the waveguide boundaries. Each integrated antenna circuit (FIGS. 1–3) will need a feedline/receptor 470 as discussed, for example, in U.S. Ser. No. 11/049,098. Each feedline/receptor 470 may be formed from as a discrete metallic part having a base pin 475 that is inserted into a metallic lump to form ohmic contacts active circuitry 410 analogous to the insertion of rods/vias 430. A metallic plate 460 may then be used to seal waveguide cavity 465 to complete microwaveguide network 415. Because network 415 is metallic, it also may function as a heat sink for cooling active circuitry 410.

Figure 5:
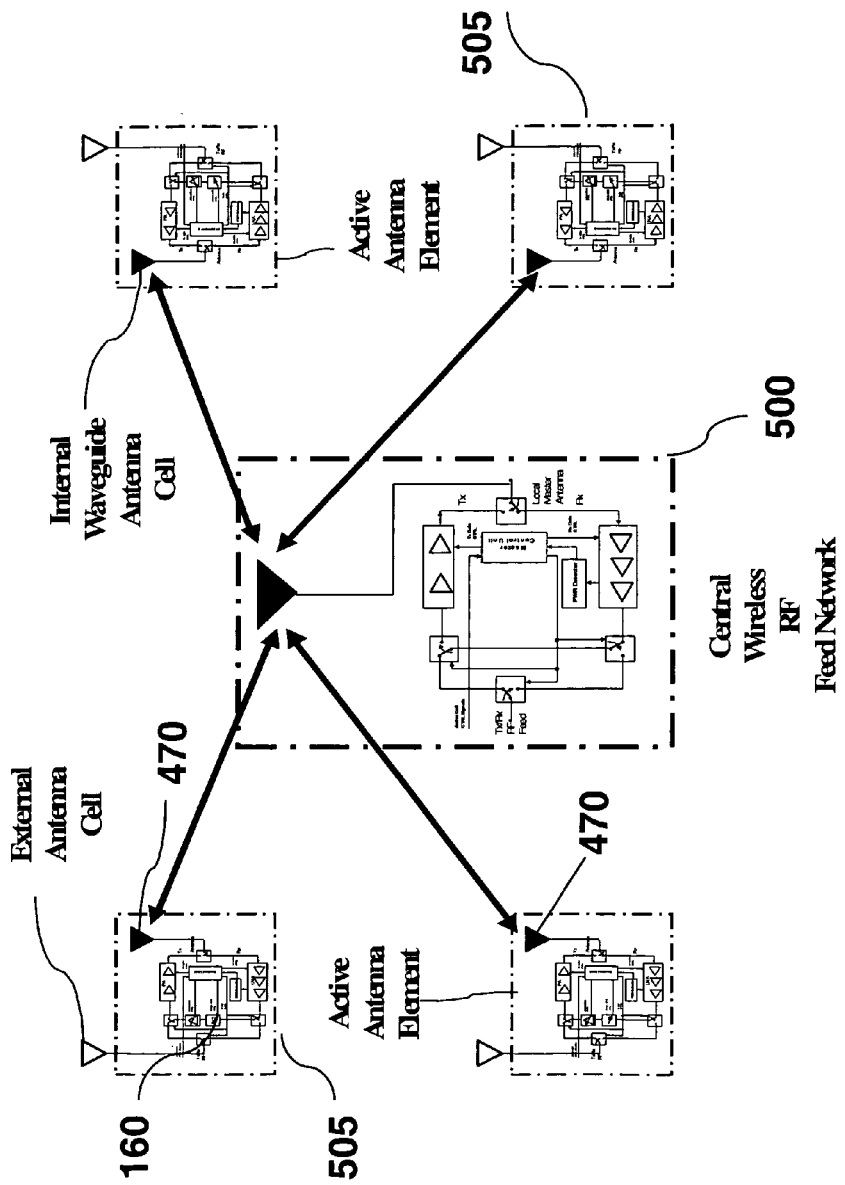
FIG. 5 illustrates a beam-forming antenna array in accordance with an embodiment of the invention.

Consider the advantages of network 415. For example, in an RF distribution scheme such as discussed with respect to FIGS. 1 and 2, a master integrated antenna circuit 500 may be used to transmit the RF signal to a plurality of slave integrated antenna circuits 505 as seen in FIG. 5. Referring back to FIG. 2, each RF beam forming interface circuit 160 within each integrated antenna circuit would include a feedline/receptor 470 to receive or provide the RF signal. Feedline/receptor 470 would be integrated into network 415 as shown in FIG. 4. Network 415 may thus be constructed in the manner of a clock tree such that the RF signal arrives in phase at each slave integrated antenna circuit 505. Alternatively, network 415 may be constructed such that the RF signal does not arrive in phase at each slave integrated antenna circuit 505. In such a case, a phase compensation factor may be determined at manufacture to account for the phase that the RF signal arrives with at a given slave integrated antenna circuit 505. For example, suppose for a certain beam forming application, it is desired that this given slave integrated antenna circuit be transmitting (or receiving) 45 degrees out of phase with respect to the master. The phase command from controller/phase manager 190 (FIG. 1) may thus be adjusted to account for the particular phase offset introduced by network 415 into the RF signal arriving at the given slave integrated antenna circuit. Advantageously, each integrated antenna circuit may be integrated onto a single semiconductor wafer. In this fashion, network 415 distributes intra-chip signals. Alternatively, separate substrates may be used for various sets of integrated antenna circuits such that network 415 distributes signals in an inter-chip fashion.

It will be appreciated that the construction of network 415 may be implemented in a number of different fashions. For example, rather than micro-machining a cavity that is then provided with a metallic coating as discussed with respect to FIG. 4, network 415 may be micro-machined out of metal and then have an insulating layer formed about network 415. Moreover, the lumen within network 415 may be air-filled or be filled with a dielectric material.

Figure 6:
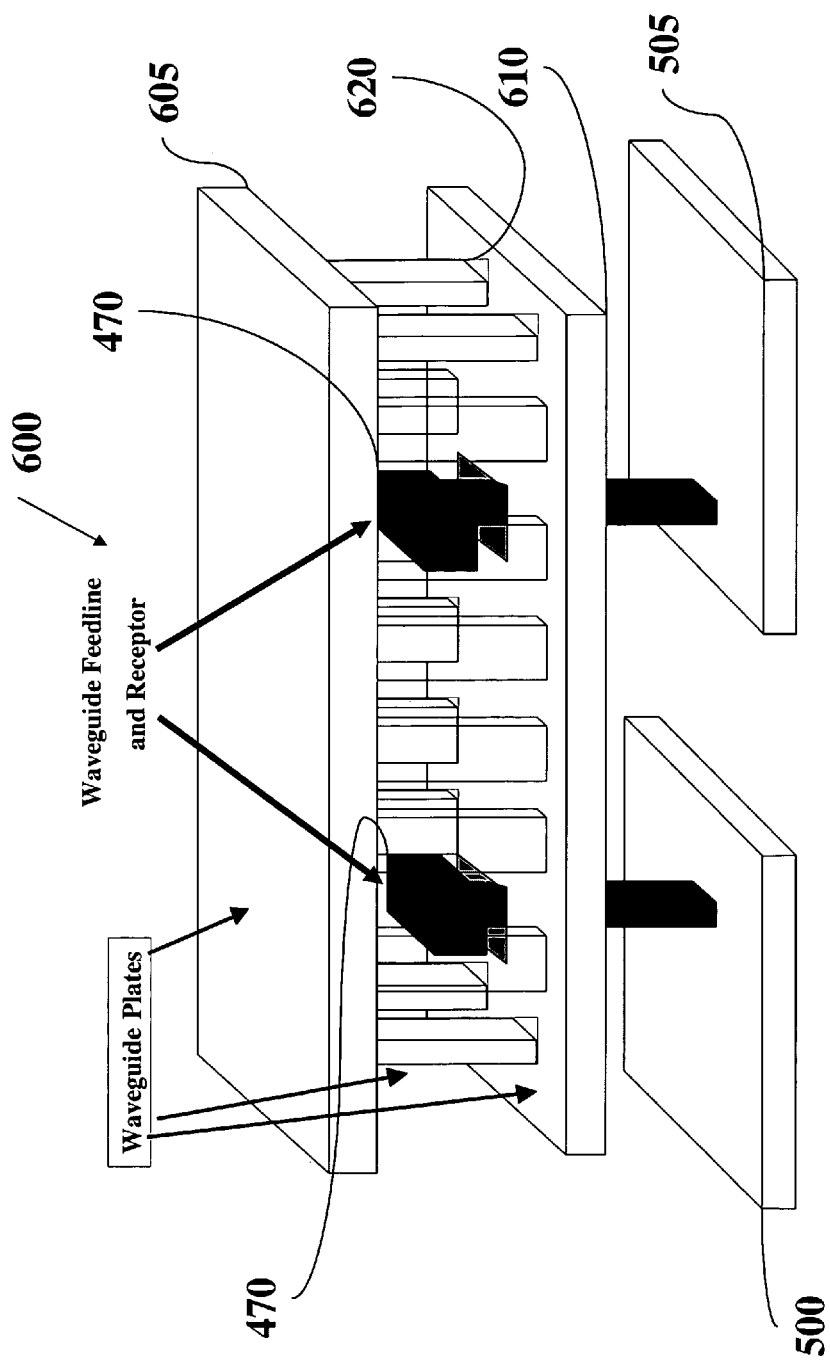
FIG. 6 is a perspective view, partially cut-away, of a portion of the waveguide network connecting a master integrated antenna circuit and a slave integrated antenna circuit in accordance with an embodiment of the invention.

As discussed analogously, for example, in U.S. Ser. 11/049,098, network 415 may be formed using metal layers in a semiconductor process such as CMOS. For example, FIG. 6 illustrates a rectangular waveguide portion 600 of network 415 connecting a master integrated antenna circuit 500 to a slave integrated antenna circuit 505. Waveguide 600 is constructed using a top metal plate 605 and a bottom metal plate 606 that are formed in corresponding metal layers. The walls of waveguide 600 are formed using conductor-filled vias 620 that connect between plates 605 and 610. A T-shaped monopole (or alternatively, a T-shaped dipole) acts as feedline/receptors 470. The use a T-shaped element for feedline/receptor 470 results in a transverse electric (TE) mode of propagation through waveguide 600.

Figure 7:
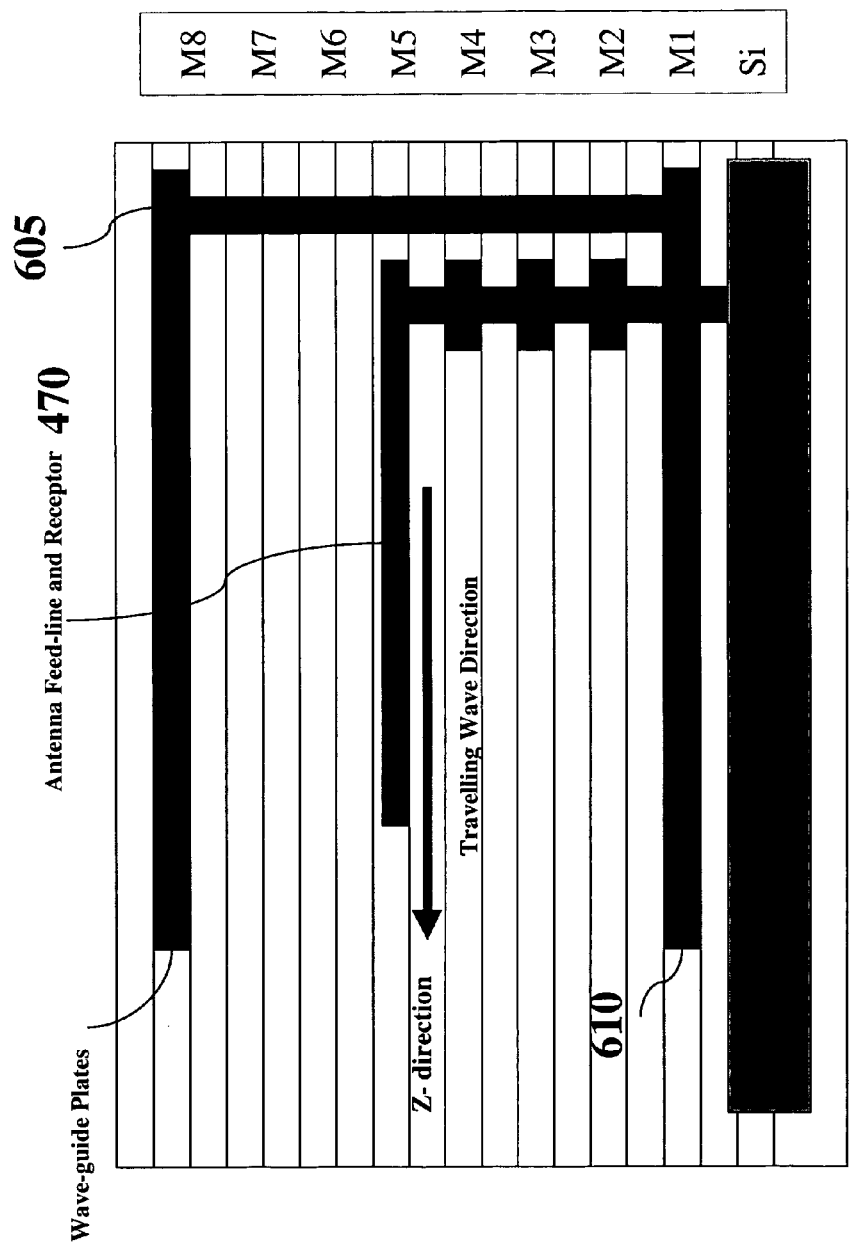
FIG. 7 is a cross-sectional view of a TM mode exciter feedline/receptor in accordance with an embodiment of the invention.
Figure 8:
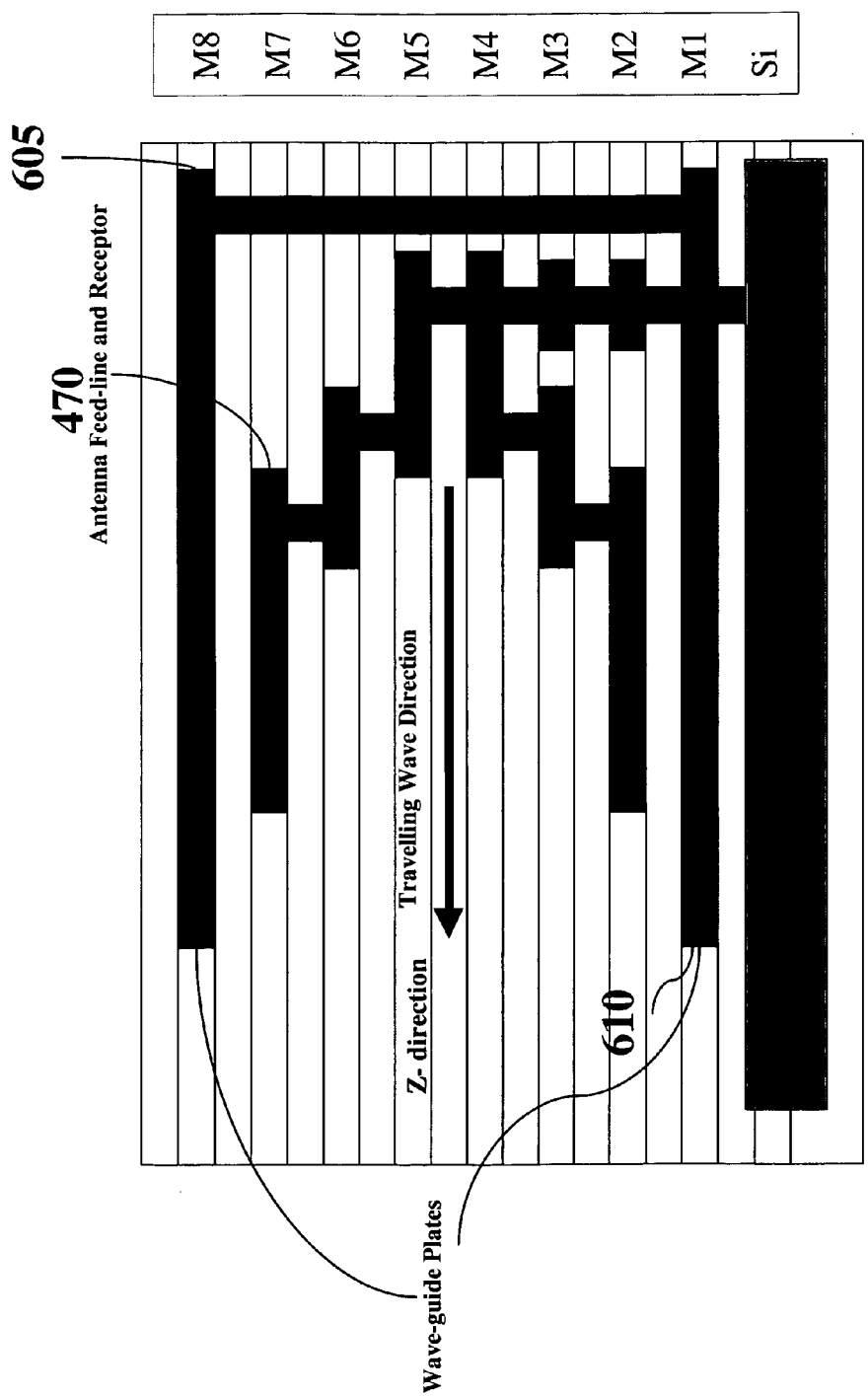
FIG. 8 is a cross-sectional view of a conical-shaped feedline/receptor in accordance with an embodiment of the invention.

In an alternative embodiment, a transverse magnetic (TM) mode of propagation may be excited using, for example, a feedline/receptor 470 configured as shown in FIG. 7. In this embodiment, the semiconductor process is such that there are eight available metal layers M1 through M8. However, it will be appreciated the number of available metal layers depends upon the particular semiconductor process being implemented. Metal layers M1 and M8 are used to form top plate 605 and bottom plate 610 of waveguide 600 as discussed with respect to FIG. 6. For illustration clarity, only a portion of these plates are shown. To excite the TM mode of propagation, feedline/receptor 470 includes a z-directed projection 620 formed in metal layer M5. Many alternative embodiments for a TM mode exciter feedline/receptor 470 may be formed. For example, as seen in FIG. 8, a conical-shaped feedline/receptor 470 may be formed using metal layers M2 through M7.

The above-described embodiments of the present invention are merely meant to be illustrative and not limiting. It will thus be obvious to those skilled in the art that various changes and modifications may be made without departing from this invention in its broader aspects. The appended claims encompass all such changes and modifications as fall within the true spirit and scope of this invention.

I claim:

1. An antenna array, comprising:

a semiconductor substrate having a first surface and an opposing second surface;

a plurality of heavily-doped contact regions extending from the first surface to the second surface;

a plurality of antennas formed on an insulating layer adjacent the first surface, each antenna being coupled to corresponding ones of the contact regions by vias;

driving circuitry formed on the second surface of the substrate, wherein the driving circuitry is configured such that each antenna corresponds to an RF beam forming interface circuit adapted to perform at least one of phase-shifting and attenuating an RF signal according to a transmit beam forming command to form an RF driving signal for driving the corresponding antenna, the RF beam forming interface circuit also adapted to perform at least one of phase-shifting and attenuating a received RF signal from the corresponding antenna according to a receive beam forming command, and a waveguide network formed in a network substrate adjacent the second surface, wherein the waveguide network is adapted to provide the RF signal to and to receive the received RF signal from each RF beam forming interface circuit.

2. The antenna array of claim 1, wherein the antennas comprise dipole antennas.

3. The antenna array of claim 1, wherein each RF beam forming circuit is adapted to only phase-shift the RF signal according to its transmit beam forming command, and wherein each RF beam forming circuit is adapted to only phase-shift its received RF signal according to its receive beam forming command.

4. The antenna array of claim 1, further comprising:
a beam forming controller adapted to provide the transmit and receive beam forming commands to each RF beam forming interface circuit.

5. The antenna array of claim 1, wherein the antennas comprise patch antennas.

6. The antenna array of claim 1, wherein each RF beam forming interface circuit includes a feedline/receptor that projects into a lumen of the waveguide network for receiving the RF signal.

7. The antenna array of claim 6, wherein each feedline/receptor is configured to excite a TE mode of propagation in the waveguide lumen.

8. The antenna array of claim 7, wherein each feedline/receptor is a T-shaped element.

9. The antenna array of claim 6, wherein each feedline/receptor is configured to excite a TM mode of propagation in the waveguide lumen.

10. The antenna array of claim 9, wherein each feedline/receptor is conical-shaped.

11. An antenna array, comprising:
a semiconductor substrate having a first surface and an opposing second surface;
a plurality of heavily-doped contact regions extending from the first surface to the second surface;
a plurality of antennas formed on an insulating layer adjacent the first surface, each antenna being coupled to corresponding ones of the contact regions by vias;
driving circuitry formed on the second surface of the substrate, wherein the driving circuitry is configured such that each antenna corresponds to a phase-locked loop and mixer, each phase-locked loop operable to receive a phase-adjusted version of a reference clock and provide an oscillator output signal that is synchronous with the phase-adjusted version of the reference clock, wherein if the phase-locked loop is configured for transmission, the oscillator output signal is upconverted in the circuit's mixer and the upconverted signal transmitted by the corresponding antenna, and wherein if the phase-locked loop is configured for reception, a received signal from the corresponding antenna is downconverted in the mixer responsive to the oscillator output signal; and
a waveguide network formed in a network substrate adjacent the second surface, wherein the waveguide network is adapted to provide the phase-adjusted versions of the reference clock to the phase-locked loops.

12. The antenna array of claim 11, wherein the antennas are patch antennas.

13. The antenna array of claim 11, wherein the antennas are dipole antennas.

14. The antenna array of claim 11, further comprising a plurality of feedline/receptors projecting into a lumen of the waveguide, wherein each feedline/receptor couples to a corresponding one of the phase-locked loops such that the phase-locked loop receives the phase-adjusted version of the reference clock through the coupled feedline/receptor.

15. The antenna array of claim 14, wherein each feedline/receptor is configured to receive a TM-propagated signal.

16. The antenna array of claim 14, wherein each feedline/receptor is configured to receive a TE-propagated signal.

* * * * *